(12) United States Patent
Kim (10) Patent No.: US 7,518,307 B2
(45) Date of Patent: Apr. 14, 2009

(54) ORGANIC ELECTROLUMINESCENT DEVICE

(75) Inventor: Hak Su Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 363 days.

(21) Appl. No.: 11/092,582

(22) Filed: Mar. 29, 2005

(65) Prior Publication Data

US 2006/0138943 A1    Jun. 29, 2006

(30) Foreign Application Priority Data

Dec. 28, 2004   (KR) .................. 10-2004-0114289
Dec. 28, 2004   (KR) .................. 10-2004-0114290
Dec. 28, 2004   (KR) .................. 10-2004-0114291

(51) Int. Cl.
   *H01J 1/62*     (2006.01)
   *G09G 3/30*     (2006.01)

(52) U.S. Cl. ................. 313/505; 313/506; 345/80

(58) Field of Classification Search ........ 313/505, 313/506; 257/40, 79; 345/76, 80
See application file for complete search history.

(56) References Cited

U.S. PATENT DOCUMENTS 6,525,467 B1 * 2/2003 Eida et al. .............. 313/506
6,538,374 B2 * 3/2003 Hosokawa .............. 313/504
7,091,657 B2 * 8/2006 Peng ...................... 313/498
7,173,373 B2 * 2/2007 Yamada et al. .......... 313/505
7,196,467 B2 * 3/2007 Takamura et al. ........ 313/506
2003/0122975 A1 * 7/2003 Kim et al. ................ 349/40
2003/0230975 A1 * 12/2003 Peng ...................... 313/504
2004/0032213 A1 * 2/2004 Kim et al. ............... 315/169.1
2005/0046343 A1 * 3/2005 Baik et al. ............... 313/504

FOREIGN PATENT DOCUMENTS

WO    WO03/075616    * 9/2003

* cited by examiner

*Primary Examiner*—Peter Macchiarolo
(74) *Attorney, Agent, or Firm*—Birch, Stewart, Kolasch & Birch, LLP (57) ABSTRACT

The present invention relates to an organic electroluminescent device including scan lines formed in parallel with ITO films between the ITO films. The organic electroluminescent device includes ITO films, scan lines, an insulating layer, organic layers, and metal layers. The ITO films are formed on a substrate. The scan lines each are formed between the ITO films on the substrate. The insulating layer is formed on other areas than luminescent areas of the ITO films and connection areas of the scan lines. The organic layers are formed on the luminescent areas. The metal line layers are formed on the organic layers and the connection area, wherein the metal line layers cross over the ITO films. In the organic electroluminescent device, the scan lines are formed between ITO films. Therefore, the brightness of the organic electroluminescent device can be enhanced, or the size of the organic electroluminescent device can be reduced.

17 Claims, 9 Drawing Sheets

ORGANIC ELECTROLUMINESCENT DEVICE

CROSS-REFERENCE TO RELATED APPLICATIONS

This application claims priority from Korean Patent Applications No. 2004-114289, 2004-114290, and 2004-114291, filed on Dec. 28, 2004, the contents of which are incorporated herein by reference in their entirety.

BACKGROUND OF THE INVENTION

1. Field of the Invention

The present invention relates to an organic electroluminescent device and a method of manufacturing the same. In particular, the present invention relates to an organic electroluminescent device including scan lines formed in parallel with indium tin oxide films (hereinafter, referred to as "ITO films") between the ITO films, and a method of manufacturing the same.

2. Description of the Related Art

An organic electroluminescent device emits light having predetermined wavelength when a predetermined voltage is applied thereto.

Figure 1:
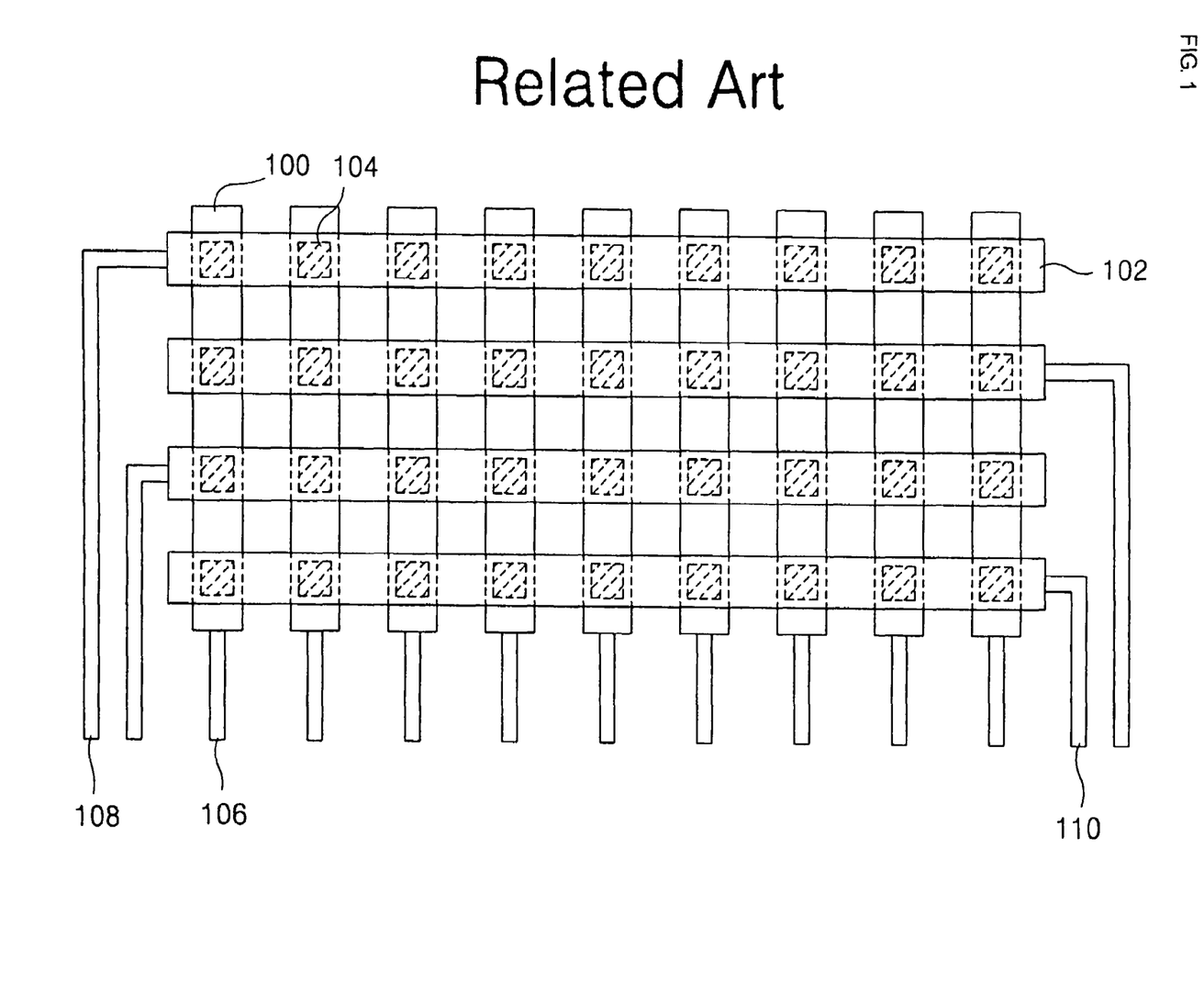
FIG. 1 is a plan view illustrating a conventional organic electroluminescent device.

FIG. 1 is a plan view illustrating a conventional organic electroluminescent device.

In FIG. 1, the conventional organic electroluminescent device includes a plurality of ITO films 100, a plurality of metal line layers 102, a plurality of data lines 106, a plurality of first scan lines 108, and a plurality of second scan lines 110.

A plurality of sub-pixels are formed in the luminescent areas 104 which are cross areas of the ITO films 100 and the metal line layers 102.

Each of the data lines 106 is connected to the ITO films 100, receives data signals transmitted from an integrated circuit chip (not shown), and provides the received data signals to the ITO films 100.

The first scan lines 108 each are connected to a part of the metal line layers 102, and provide first scan signals transmitted from the integrated circuit chip to the above partial metal line layers.

The second scan lines 110 each are connected to the other metal line layers, and provide second scan signals transmitted from the integrated circuit chip to the other metal line layers.

For example, each of the first scan lines 108 is connected to odd numbers of metal line layers of the metal line layers 102, and each of the second scan lines 110 is connected to even numbers of metal line layers of the metal line layers 102.

As described above, in the conventional organic electroluminescent device, the scan lines 108 and 110 are formed outside the metal line layers 102 as shown in FIG. 1.

Generally, a plurality of organic electroluminescent devices are formed on a substrate. In this case, if the scan lines 108 and 110 are formed outside the metal line layers 102 as in conventional organic electroluminescent devices, the space of the substrate may be reduced as much as the scan lines 108 and 110 occupy. As a result, the number of organic electroluminescent devices formed on the substrate in the conventional organic electroluminescent device may be less than that of organic electroluminescent devices formed on the substrate when the scan lines 108 and 110 don't occupy outside space of the metal line layers 102.

Therefore, development of an organic electroluminescent device that can reduce the space occupied by scan lines has been required.

SUMMARY OF THE INVENTION

It is a feature of the present invention to provide an organic electroluminescent device having scan lines formed between ITO films, and a method of manufacturing the same.

It is another feature of the present invention to provide an organic electroluminescent device having a scan line connection section for connecting the scan lines, and a method of manufacturing the same.

It is still another feature of the present invention to provide an organic electroluminescent device substrate placing data line connection sections of a first organic electroluminescent device and a scan line connection section of a second organic electroluminescent device on the same plane surface.

An organic electroluminescent device according to a first embodiment of the present invention includes ITO films, scan lines, an insulating layer, organic layers, and metal layers. The ITO films are formed on a substrate. The scan lines are formed between the ITO films on the substrate. The insulating layer is formed on other areas than luminescent areas of the ITO films and connection areas of the scan lines. The organic layers are formed on the luminescent areas. The metal line layers are formed on the organic layers and the connection areas, wherein the metal line layers cross over the first ITO films.

An organic electroluminescent device according to a second embodiment of the present invention includes ITO films, scan lines, an insulating layer, organic layers, metal line layers, and a scan line connection section. The ITO films are formed on a substrate. The scan lines are formed between the ITO films on the substrate. The insulating layer is formed on other areas than luminescent areas of the ITO films and connection areas of the scan lines. The organic layers are formed on the luminescent areas. The metal line layers formed on the organic layers and the connection areas, wherein the metal lines layers cross over the ITO films. The scan line connection section connects the scan lines.

An organic electroluminescent device according to a third embodiment of the present invention includes ITO films, scan lines, an insulating layer, organic layers, metal line layers, and scan line connection sections. The ITO films are formed on a substrate. The scan lines are formed between the ITO films on the substrate. The insulating layer is formed on other areas than luminescent areas of the ITO films and connection areas of the scan lines. The organic layers are formed on the luminescent areas. The metal line layers are formed on the organic layers and the connection areas, wherein the metal line layers cross over the ITO films. The scan line connection sections connect the scan lines in the unit of K (K is an integer of above 2).

An organic electroluminescent device according to a fourth embodiment of the present invention, which has ITO films and metal line layers crossing over the ITO films, also includes data lines, data line connection sections, scan lines, and a scan line connection section. The data lines are connected to the ITO films. The data line connection sections connect the data lines in the unit of L (L is an integer of above 2). The scan lines are formed between the ITO films. The scan line connection section connects the scan lines.

An organic electroluminescent device substrate according to one embodiment of the present invention includes a first organic electroluminescent device and a second organic electroluminescent device. The first organic electroluminescent device includes at least one data line connection section for connecting a plurality of data lines connected to first ITO films in the unit of N (N is an integer of above 2). The second organic electroluminescent device includes at least one scan line connection section for connecting a plurality of scan lines formed in parallel with second ITO films between the second ITO films in the unit of P (P is an integer of above 2). Here, the data line connection section and the scan line connection section are placed on the same plane surface.

A method of manufacturing an organic electroluminescent device according to an embodiment of the present invention includes a step of forming a plurality of first ITO films on a substrate, forming a plurality of scan lines in parallel with the first ITO films between the first ITO films; depositing insulating material on other areas than luminescent areas and connection areas on the whole area of the substrate on which the first ITO films and the scan lines are formed; depositing organic layer on the luminescent areas; and forming a plurality of metal line layers crossing over the first ITO films on the luminescent areas and the connection areas.

A method of manufacturing the organic electroluminescent device according to another embodiment of the present invention includes forming a plurality of ITO films on a substrate; forming a plurality of scan lines in parallel with the ITO films between the ITO films; forming scan line connection section for connecting the scan lines; depositing insulating material on other areas than luminescent areas and connection areas on the whole areas of the substrate on which the ITO films and the scan lines are formed; depositing an organic layer on the luminescent areas; and forming a plurality of metal line layers crossing over the ITO films on the luminescent areas and the connection areas.

As described above, in the organic electroluminescent device of the present invention, scan lines are formed between ITO films. Thus, brightness of the organic electroluminescent device can be enhanced at the same size of substrate, and the size of the organic electroluminescent device can be reduced.

In addition, the organic electroluminescent device of the present invention provides predetermined voltage to the ITO films and the metal line layers with using the line connection sections and the line terminal sections at the time of quality test. Hence, the lines of the organic electroluminescent device are not damaged by pins of the test apparatus.

Additionally, in the organic electroluminescent device substrate of the present invention, the scan line connection section of the second organic electroluminescent device is located between the data line connection sections of the first organic electroluminescent device. Thus, the number of organic electroluminescent device on the substrate can be increased in the horizontal direction, and the substrate of the organic electroluminescent device can fully utilize its space in the longitudinal direction.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF EMBODIMENTS

Hereinafter, preferred embodiments of the present invention will be explained in more detailed with reference to the accompanying drawings.

Figure 2:
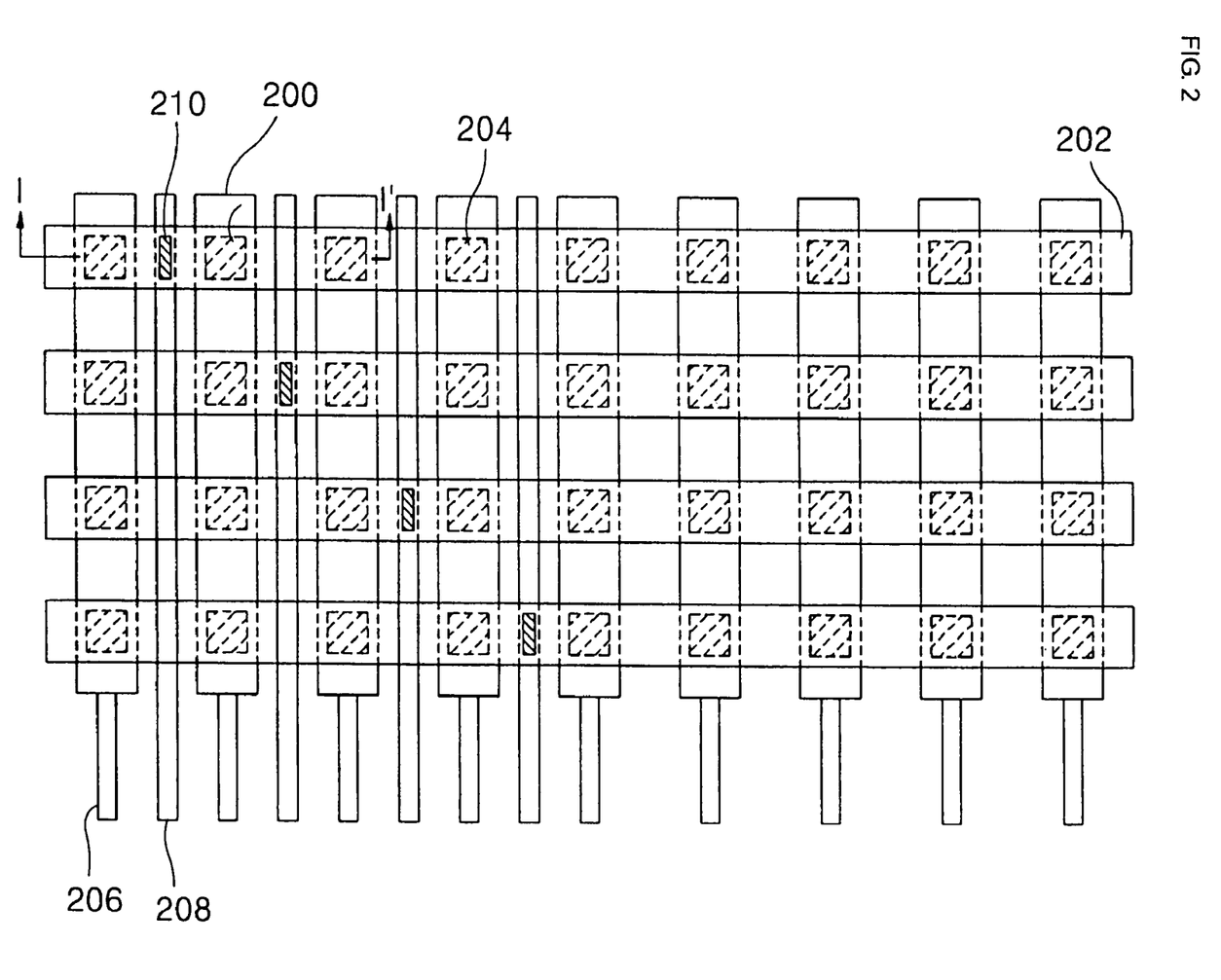
FIG. 2 is a plan view illustrating the organic electroluminescent device according to the first embodiment of the present invention.

FIG. 2 is a plan view illustrating the organic electroluminescent device according to the first embodiment of the present invention. Here, FIG. 2 shows the organic electroluminescent device having the size of 3 (horizontal direction)×4 (vertical direction) for the convenience of description.

In FIG. 2, the organic electroluminescent device of the present invention includes ITO films 200, metal line layers 202, data lines 206, and scan lines 208.

A plurality of sub-pixels are formed in luminescent areas 204 which are cross areas of the ITO films 200 and the metal line layers 202. In particular, red sub-pixels are formed in first luminescent areas, green sub-pixels in second luminescent areas, and blue sub-pixels in third luminescent areas, of the luminescent areas 204. Here, a pixel consists of a red sub-pixel, a green sub-pixel, and a blue sub-pixel.

Each of the data lines 206 is connected to the ITO films 200 as shown in FIG. 2, and transmits plural data signals provided from integrated circuit chip (not shown) to the ITO films 200.

The scan lines 208 are formed between the ITO films 200 as shown in FIG. 2, and cross over the metal line layers 202. In other words, the scan lines 208 are formed in parallel with, and between, the ITO films 200.

Insulating material is deposited on other areas than a part (hereinafter, referred to as "connection area") 210 of the whole area of the scan lines 208. In other words, only the scan lines 208 are formed on the connection areas 210, and the scan lines 208 and the insulating material of the scan lines 208 is deposited on the scan lines 208 on the other areas than the connection areas 210.

Thus, in case the scan signals are sent to the scan lines 208 from the integrated circuit chip, the scan lines 208 transmit thus sent scan signals to the metal line layers 202 through the connection areas 210.

In short, unlike the scan lines of a conventional organic electroluminescent device, the scan lines 208 of the organic electroluminescent device of the present invention are formed between the ITO films 200. As a result, the organic electroluminescent device of the present invention has extra space as much as the scan lines occupied in the conventional organic electroluminescent device.

Hence, the organic electroluminescent device of the present invention may have more pixels corresponding to the above extra space. Alternatively, the organic electroluminescent device may enlarge the width of ITO films 200, i.e., the size of luminescent areas 204, as much as the above extra space. As a result, brightness of the organic electroluminescent device of the present invention can be enhanced, compared with the conventional organic electroluminescent device.

Additionally, the organic electroluminescent device may reduce its size as much as the above extra space, and so can be miniaturized.

Hereinafter, a method of manufacturing the organic electroluminescent device of the present invention will be described in detail.

ITO film material is deposited on a substrate.

The substrate is patterned as shown in FIG. 2, and so the ITO films 200 are formed on the substrate.

The data lines 206 are connected to the ITO films 200, and then the scan lines 208 crossing over the metal line layers 202 are formed between the ITO films 200.

The insulating material is deposited on the substrate on which the ITO films 200, the data lines 206, and the scan lines 208 are formed. However, the insulating material is not deposited on the luminescent areas 204 and the connection areas 210.

The substrate on which the insulating material is deposited is patterned, and so the deposited insulating material is removed from the substrate.

Each of organic layers is deposited on the luminescent areas 204.

The metal line layers 202 are formed on the substrate having the organic layers.

Figure 3:
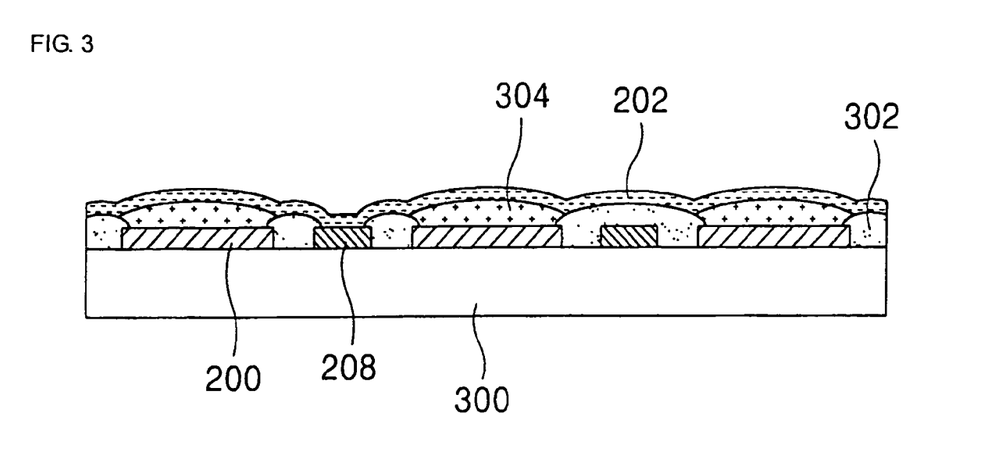
FIG. 3 is a cross-sectional view illustrating the organic electroluminescent device taken along the I-I' line of FIG. 2.

FIG. 3 is a cross-sectional view illustrating the organic electroluminescent device taken along the I-I' line of FIG. 2 according to the first embodiment of the present invention.

As shown in FIG. 3, the scan lines 208 are formed between the ITO films 200 of the substrate. Each of the scan lines 208 according to the first embodiment of the present invention is metal layer, for example, consisted of molybdenum (MO).

An insulating layer 302 is formed between the ITO films 200 as shown in FIG. 3. Only, the insulating layer 302 is not formed on a first scan line of the scan lines 208, and is formed on the other scan lines thereof.

Thus, only the first scan line is connected to a first metal line layer corresponding to the first scan line of the metal line layers 202, and so the scan signal provided from the integrated circuit chip is transmitted to the first metal line layer through the first scan line.

The organic layers 304 are formed on the luminescent areas 204 of the ITO films 200. Here, each of the organic layers 304 includes a hole transporting layer (HTL), an emitting layer (EML), and an electron transporting layer (ETL), which are formed in sequence on the ITO films 200. Alternatively, each of the organic layers 304 includes a hole injection layer (HIL), HTL, EML, ETL, and an electron injection layer (EIL), which are formed in sequence on the ITO films 200.

The metal line layer 202 is formed on the organic layers 304 and the insulating layer 302.

Figure 4:
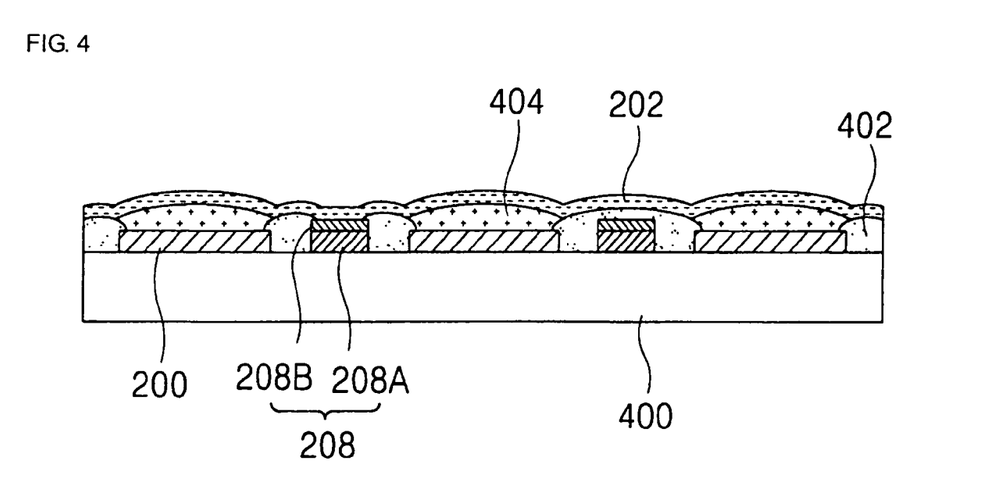
FIG. 4 is a cross-sectional view illustrating the organic electroluminescent device taken along the I-I' line of FIG. 2.

FIG. 4 is a cross-sectional view illustrating the organic electroluminescent device taken along the I-I' line of FIG. 2 according to the second embodiment of the present invention.

As shown in FIG. 4, the scan lines 208 each include a second ITO film 208A and a metal layer 208B, which are deposited in sequence on the substrate 400.

The metal line layer 208B is weakly stuck to the substrate 400. Thus, in the present organic electroluminescent device, the second ITO film 208A having strong cohesiveness with the substrate 400 is formed on the substrate 400, and then the metal layer 208B is formed on the second ITO film 208A.

The metal layer 208B according to one embodiment of the present invention includes molybdenum (MO).

Figure 5:
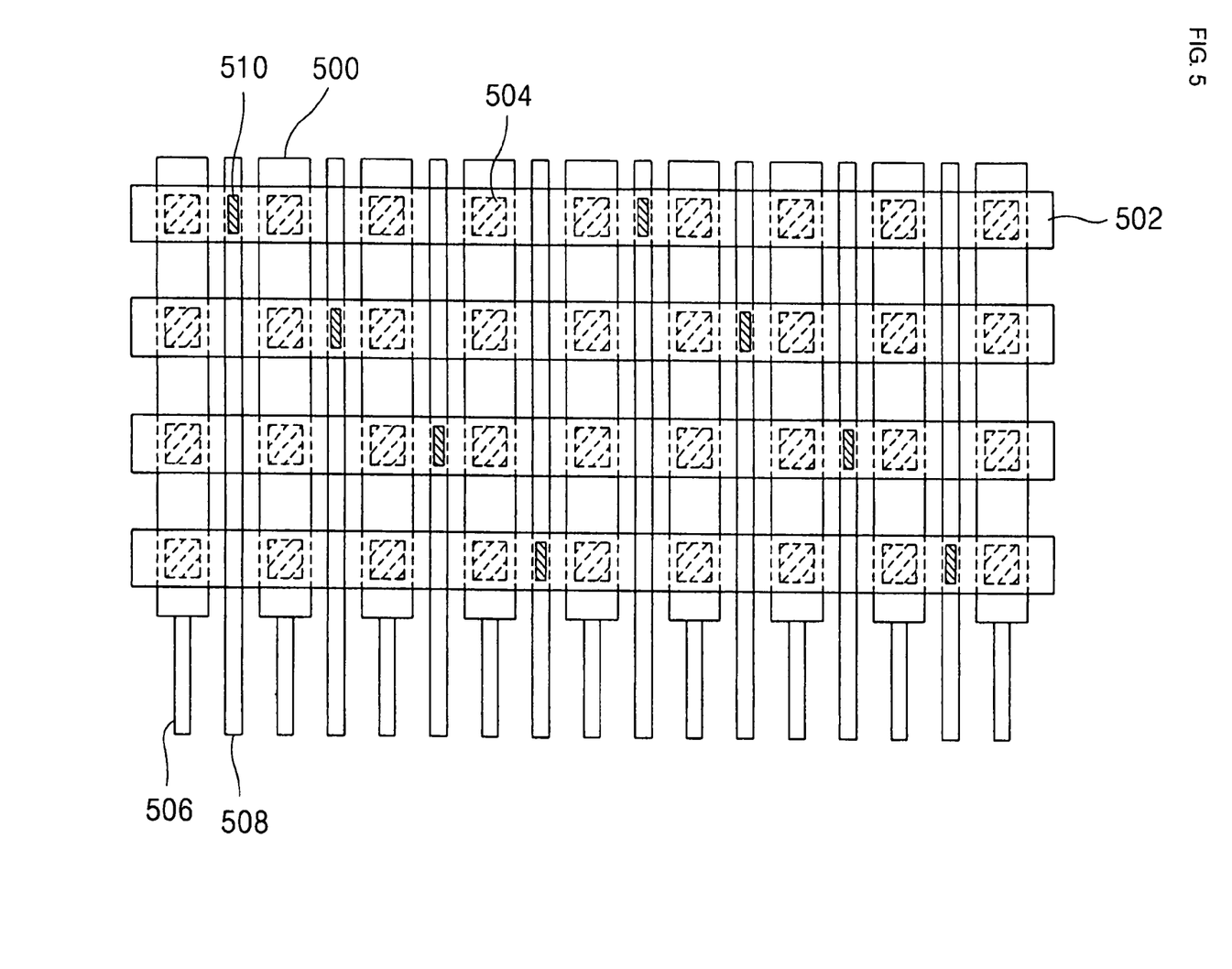
FIG. 5 is a plan view illustrating the organic electroluminescent device according to the third embodiment of the present invention.

FIG. 5 is a plan view illustrating the organic electroluminescent device according to the third embodiment of the present invention.

In FIG. 5, one metal line layer is connected to two scan lines at two connection areas 510.

Hence, the integrated circuit chip may provide a scan signal through the scan line corresponding to a first connection area of the two connection areas 510 to the metal line layer corresponding to the first connection area.

Now referring to FIG. 3 and FIG. 5, the present organic electroluminescent device may connect a metal line layer to a plurality of scan lines within the extent allowed by size.

Figure 6:
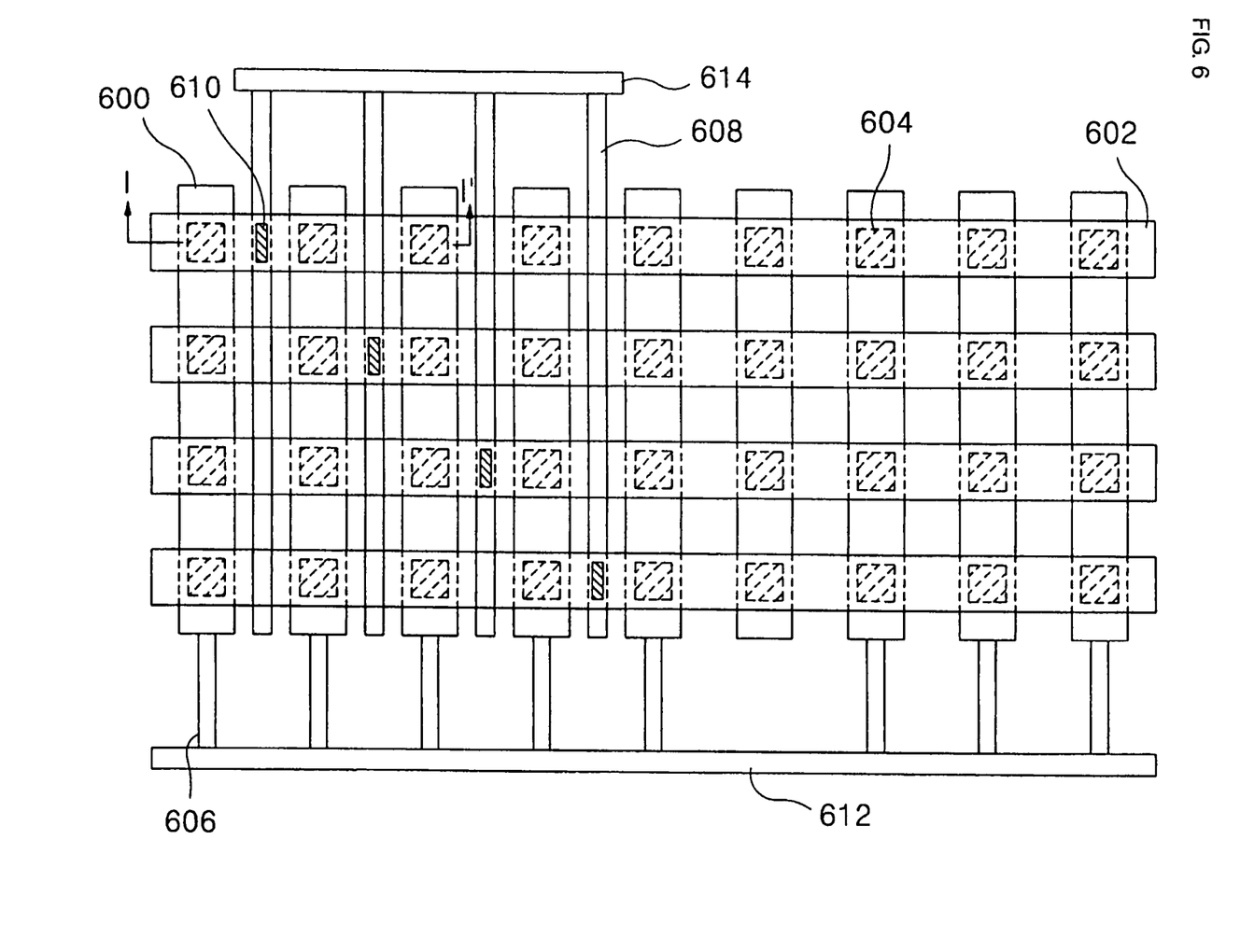
FIG. 6 is a plan view illustrating the organic electroluminescent device according to the fourth embodiment of the present invention.

FIG. 6 is a plan view illustrating the organic electroluminescent device according to the fourth embodiment of the present invention.

In FIG. 6, the organic electroluminescent device includes ITO films 600, metal line layers 602, data lines 606, scan lines 608, a data line connection section 612, and a scan line connection section 614.

The elements of the present embodiment are the same as those of the first embodiment except the line connection sections 612 and 614, and so further detailed descriptions concerning the same elements will be omitted.

The data line connection section 612 connects the data lines 606 as electric conductor, and the scan line connection section 614 connects the scan lines 608 as electric conductor.

Below, the function of the line connection sections 612 and 614 is described in detail through the brightness test of the organic electroluminescent device.

In testing brightness of the organic electroluminescent device, a first pin of a test apparatus comes into contact with one of the data lines 606, and then a predetermined positive voltage is applied to the contacted data line through the first pin. In this case, the data lines 606 are connected one another by the data line connection section 612, and so the applied positive voltage is provided to the other data lines through the contacted data line and the data line connection section 612. Subsequently, the positive voltage is provided to the ITO films 600 through the data lines 606.

In addition, a second pin of the test apparatus comes into contact with one of the scan lines 608, and then a predetermined negative voltage is applied to the contacted scan line through the second pin. As a result, the applied negative voltage is provided to the metal line layers 602 through the scan lines 608.

In other words, the test apparatus applies the positive voltage and the negative voltage to the ITO films 600 and the metal line layers 602, respectively, and so the pixels emit light.

The test apparatus detects brightness defect of the organic electroluminescent device through the emitted light.

After the brightness test of the organic electroluminescent device is finished, the line connection sections 612 and 614 are amputated by a scribing blade.

As described above, in the organic electroluminescent device of the present invention, the number of pin of the test apparatus contacted with the lines 606 and 608 is 2. That is, the number of pins required for testing in the organic electroluminescent device of the present invention is much less than in a conventional organic electroluminescent device in which the pins had to contact all the lines. Thus, possibility to be damaged by the pins in case of the lines 606 and 608 of the organic electroluminescent device in the present invention is much less than in a conventional organic electroluminescent device.

Hereinafter, a method of manufacturing the organic electroluminescent device of the present invention is described in detail.

ITO film material is deposited on the substrate.

The substrate on which the ITO film material is deposited is patterned, and so the ITO films 600 are formed on the substrate as shown in FIG. 6.

The data lines 606 are connected to the ITO films 600, and the scan lines 608 crossing over the metal line layers 602 are formed between the ITO films 600.

The data line connection section 612 and the scan line connection section 614 are connected to the data lines 606 and the scan lines 608, respectively. Here, the data line connection section 612 and the scan line connection section 614 may be formed during the patterning process of the substrate on which the ITO film material is deposited.

The insulating material is deposited on the substrate on which the lines 606 and 608 are formed, but is not formed on the luminescent areas 604 and the connection areas 610.

The organic layers are deposited on the luminescent areas 604.

The metal line layers 602 are formed on the substrate having the deposited organic layers.

Figure 7:
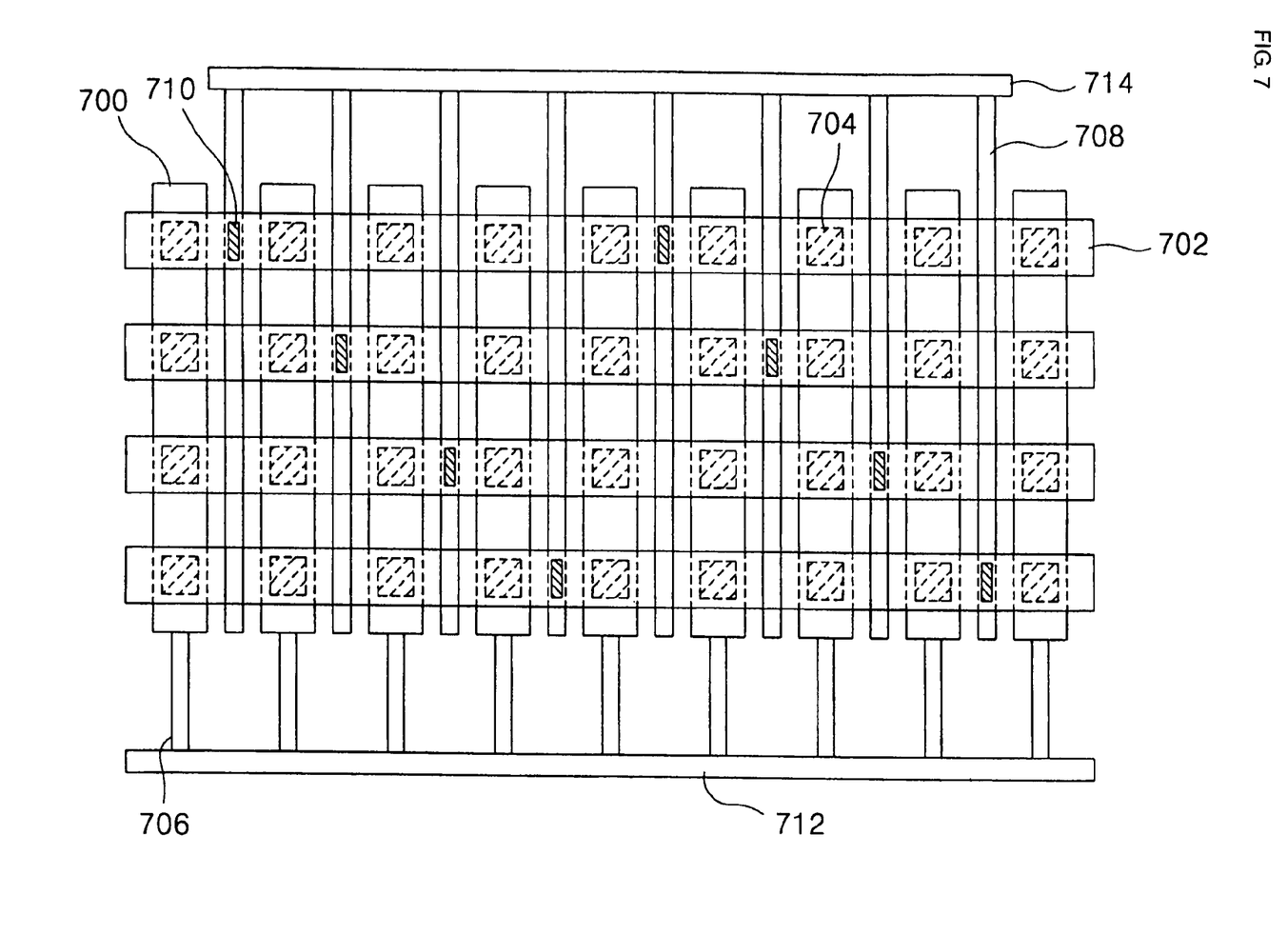
FIG. 7 is a plan view illustrating the organic electroluminescent device according to the fifth embodiment of the present invention.

FIG. 7 is a plan view illustrating the organic electroluminescent device according to the fifth embodiment of the present invention.

In FIG. 7, one metal line layer is connected to two scan lines at two connection areas 710.

Hence, the integrated circuit chip may provide a scan signal through a scan line corresponding to a first connection area of the two connection areas 710 to a metal line layer corresponding to the first connection area.

A data line connection section 712 connects data lines 706, and a scan line connection section 714 connects scan lines 708.

Figure 8:
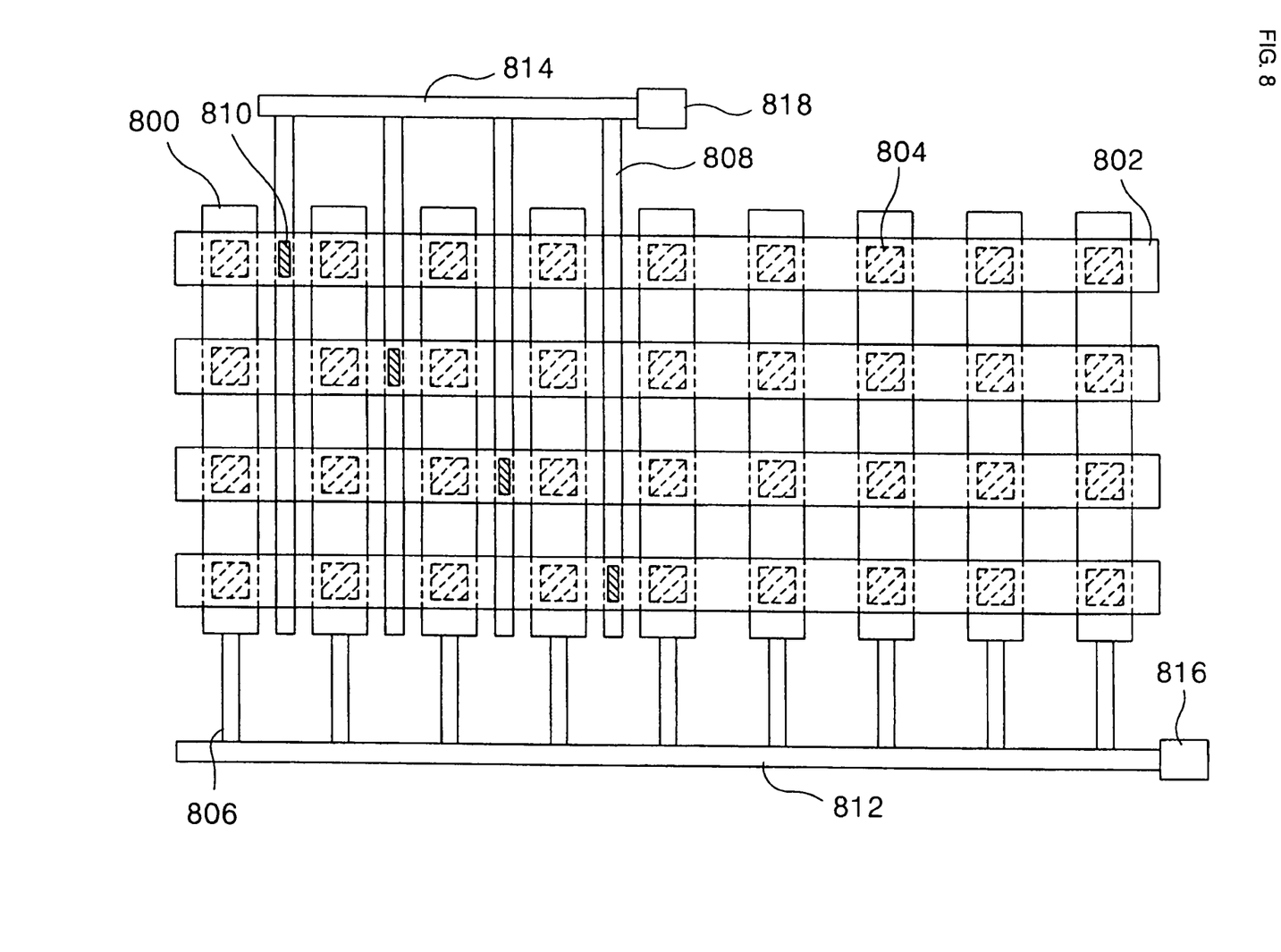
FIG. 8 is a plan view illustrating the organic electroluminescent device according to the sixth embodiment of the present invention.

FIG. 8 is a plan view illustrating the organic electroluminescent device according to the sixth embodiment of the present invention.

In FIG. 8, the organic electroluminescent device of the present invention includes ITO films 800, metal line layers 802, data lines 806, scan lines 808, a data line connection section 812, a scan line connection section 814, a data line terminal section 816, and a scan line terminal section 818.

Since the elements of the present embodiment except the line terminal sections 816 and 818 are the same as those of the fourth embodiment, further detailed descriptions concerning the same elements will be omitted.

When a test apparatus tests brightness of the organic electroluminescent device, a first pin of the test apparatus comes into contact with the data line terminal section 816, and then a predetermined positive voltage is applied to the contacted data line terminal section 816 through the first pin.

The data line terminal section 816 provides the applied positive voltage to the ITO films 800 through the data line connection section 812 and the data lines 806.

Additionally, a second pin of the test apparatus comes into contact with the scan line terminal section 818, and then a predetermined negative voltage is applied to the scan line terminal section 818 through the second pin.

The scan line terminal section 818 provides the applied negative voltage to the metal line layers 802 through the scan line connection section 814 and the scan lines 808.

In short, in the organic electroluminescent device, the pins come into contact with the line terminal sections 816 and 818, but do not come into contact with the lines 806 and 808. Therefore, the lines 806 and 808 are not damaged by the pins.

Figure 9:
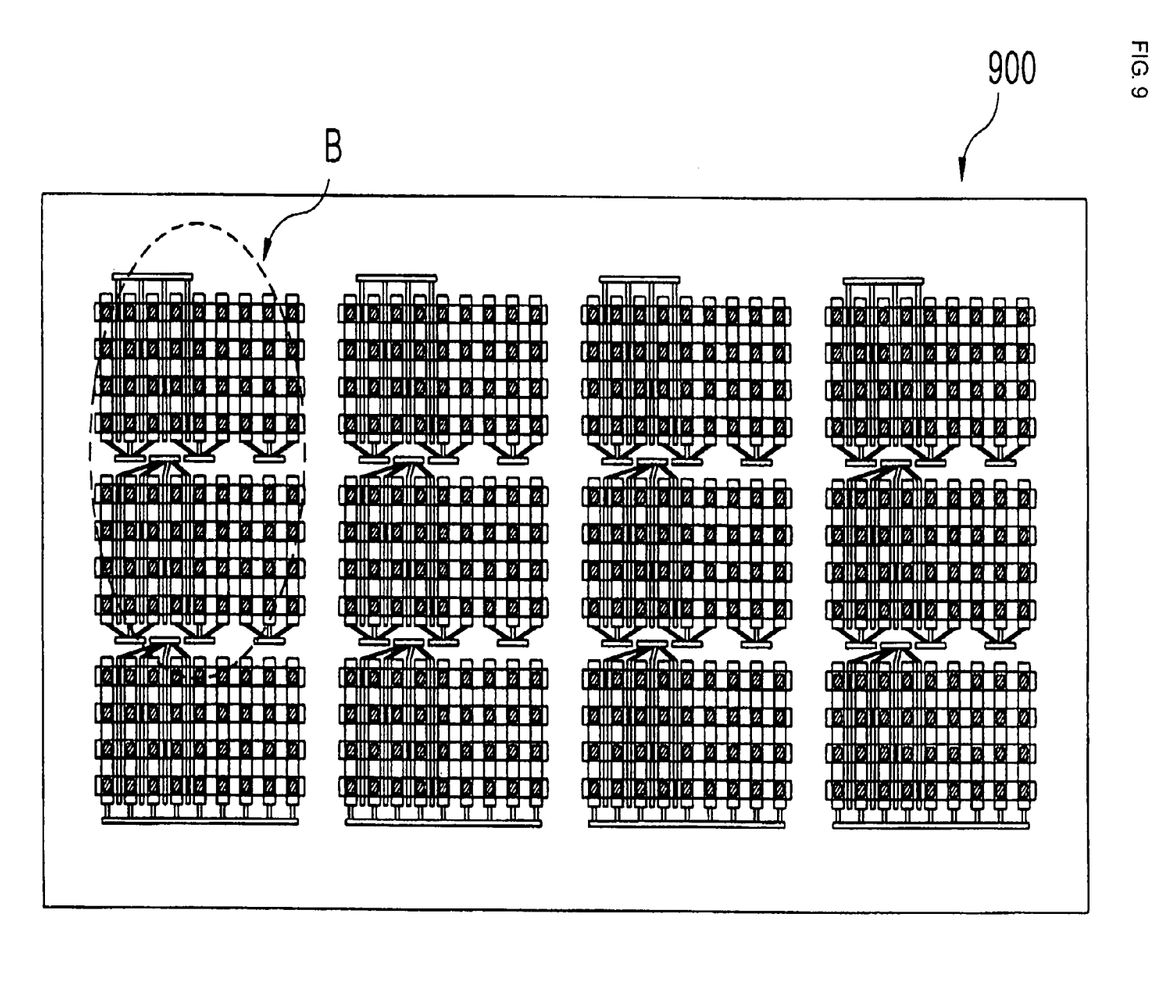
FIG. 9 is a plan view illustrating the organic electroluminescent device substrate according to one embodiment of the present invention.

FIG. 9 is a plan view illustrating the organic electroluminescent device substrate according to one embodiment of the present invention. In addition, FIG. 10 is a plan view enlarging B part in FIG. 9.

In FIG. 9, the substrate 900 includes a plurality of organic electroluminescent devices.

Figure 10:
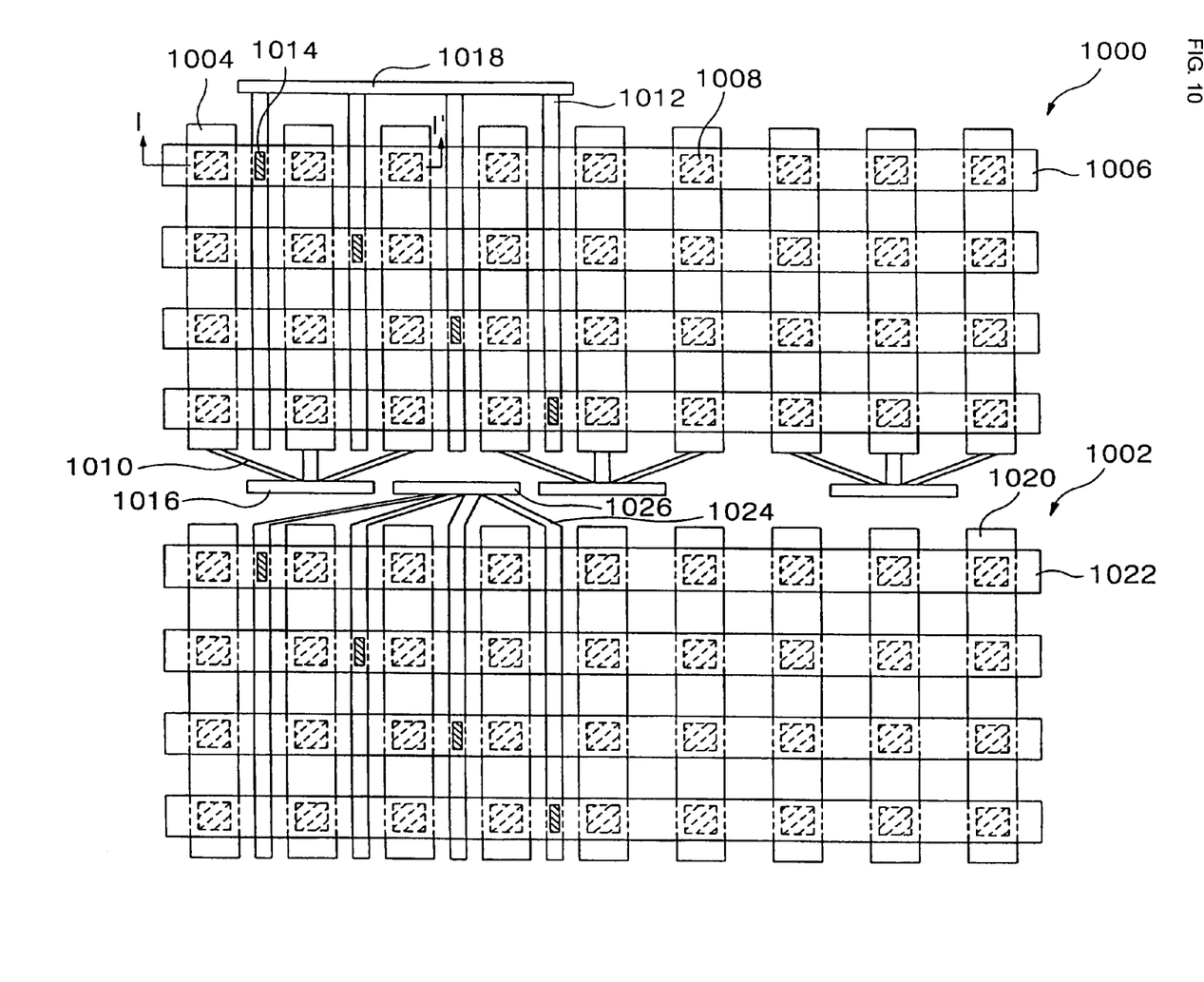
FIG. 10 is a plan view enlarging B part in FIG. 9.

In FIG. 10, the substrate includes a first organic electroluminescent device 1000 and a second organic electroluminescent device 1002.

Hereinafter, the function of the organic electroluminescent devices through the first organic electroluminescent device 1000 is described in detail, and then the position relation between the above organic electroluminescent devices is described.

The first organic electroluminescent device 1000 includes first ITO films 1004, first metal line layers 1006, first data lines 1010, first scan lines 1012, first data line connection sections 1016, and a first scan line connection section 1018.

Since the elements of the present embodiment except the line connection sections 1016 and 1018 are the same as those of the first embodiment, further detailed descriptions concerning the same elements will be omitted The first data line connection sections 1016 connect the first data lines 1010 in the unit of K (K is an integer of above 2) as electric conductor. For example, the first data line connection sections 1016 connect the first data lines 1010 in the unit of 3 as shown in FIG. 10.

In addition, the first data line connection sections 1016 provide a predetermined first voltage applied from the test apparatus to the first ITO films 1004 through the first data lines 1010.

The first scan line connection section 1018 connects the first scan lines 1012 as electric conductor.

The first scan lines 1012 according to one embodiment of the present invention may be connected in the unit of M (M is an integer of above 2) by a plurality of scan line connection sections.

Additionally, the first scan line connection section 1018 provides a predetermined second voltage applied from the test apparatus to the metal line layers 1006 through the first scan lines 1012.

Hereinafter, the position relation between the first organic electroluminescent device 1000 and the second organic electroluminescent device 1002 is described in detail.

Now, in FIG. 10, the first data lines 1010 are connected in the unit of 3 to the first data line connection sections 1016.

A plurality of second scan lines 1024 are connected to a second scan line connection section 1026.

The second scan line connection section 1026 of the second organic electroluminescent device 1002 is located between the first data line connection sections 1016.

The second scan line connection section 1026 according to another embodiment of the present invention may be located outside the outermost data line connection, but is not located between the first data line connection sections 1016.

In other words, the second scan line connection section 1026 and the first data line connection sections 1016 are located on the same plane surface. In addition, the second scan line connection section 1026 is formed in parallel with the first metal line layers 1006 on the substrate 900. As a result, the space of the substrate 900 can be fully utilized.

The second scan lines 1024 according to another embodiment of the present invention may be connected in the unit of L (L is an integer of above 2) by second scan line connection sections. In this case, the second scan line connection sections and the first data line connection sections 1016 are located in the same plane surface. Additionally, the second scan line connection sections are formed in parallel with the first metal line layers 1006 on the substrate 900.

In short, in the substrate 900, the second scan line connection section 1026 of the second organic electroluminescent device 1002 is located between the first data line connection sections 1016 of the first organic electroluminescent device 1000. Hence, the substrate 900 can save the space corresponding to the scan lines area of the conventional organic electroluminescent device in the horizontal direction, and can fully utilize the space of the substrate in the longitudinal direction.

From the preferred embodiments for the present invention, it is noted that modifications and variations can be made by a person skilled in the art in light of the above teachings. Therefore, it should be understood that changes may be made for a particular embodiment of the present invention within the scope and spirit of the present invention outlined by the appended claims.

What is claimed is:

1. An organic electroluminescent device having a substrate, comprising:
    a plurality of first ITO (indium tin oxide) films formed on the substrate and each having a plurality of luminescent areas;
    a plurality of scan lines formed on the substrate, each of the plurality of scan lines having a corresponding connection area, wherein each of the plurality of scan lines are located between respective pairs of the plurality of first ITO films and are substantially parallel with the plurality of first ITO films;
    an insulating layer formed on the plurality of first ITO films and the plurality of scan lines so as to expose the plurality of luminescent areas and connection areas of the plurality of scan lines;
    a plurality of organic layers, each organic layer formed on a respective one of the plurality of luminescent areas; and
    a plurality of metal line layers formed on the organic layers, the connection areas and the insulating layer, wherein the plurality of metal line layers are substantially orthogonal to the plurality of first ITO films.

2. The organic electroluminescent device of claim 1, wherein the plurality of scan lines include a metal.

3. The organic electroluminescent device of claim 1, wherein each of the plurality of scan lines includes a second ITO film and a metal layer formed on the substrate.

4. The organic electroluminescent device of claim 1, wherein each of the connection areas is connected to one of the plurality of metal line layers.

5. An organic electroluminescent device having a substrate, comprising:
    a plurality of ITO (indium tin oxide) films formed on the substrate and each having a plurality of luminescent areas;
    a plurality of scan lines formed on the substrate, each of the plurality of scan lines having a corresponding connection area, wherein each of the plurality of scan lines are located between respective pairs of the plurality of ITO films and are substantially parallel with the plurality of ITO films;
    an insulating layer formed on the plurality of ITO films and the plurality of scan lines so as to expose the plurality of luminescent areas and the plurality of connection areas;
    a plurality of organic layers, each organic layer formed on a respective one of the plurality of luminescent areas;
    a plurality of metal line layers formed on the plurality of organic layers, the insulating layer and the connection areas, wherein the plurality of metal lines layers are substantially orthogonal to the plurality of ITO films; and
    a scan line connection section connecting the plurality of scan lines, wherein
    the scan line connection section is substantially parallel to the plurality of metal line layers.

6. The organic electroluminescent device of claim 5, wherein the scan line connection section comprises an electric conductor.

7. The organic electroluminescent device of claim 5, further including a scan line terminal section connected to the scan line connection section and arranged to provide the plurality of scan lines with a predetermined first voltage through the scan line connection section.

8. The organic electroluminescent device of claim 5, further including a plurality of data lines parallel to the plurality of scan lines and a data line connection section connecting the plurality of data lines.

9. The organic electroluminescent device of claim 8, further including a data line terminal section connected to the data line connection section and arranged to provide the plurality of data lines with a predetermined second voltage applied through the data line connection section.

10. An organic electroluminescent device having a substrate, comprising:
    a plurality of ITO films formed on the substrate, each having a plurality of luminescent areas;
    a plurality of scan lines formed on the substrate, each of the plurality of scan lines having a connection area, wherein each of the plurality of scan lines are located between respective pairs of the plurality of ITO films and are substantially parallel with the plurality of ITO films;
    an insulating layer formed on the plurality of ITO films and the plurality of scan lines so as to expose the plurality of luminescent areas and the plurality of connection areas;
    a plurality of organic layers, each organic layer formed on a respective one of the plurality of luminescent areas;
    a plurality of metal line layers formed on the plurality of organic layers, the insulating layer and the connection areas, wherein the plurality of metal line layers are substantially orthogonal to the plurality of ITO films; and
    a plurality of scan line connection sections connecting the plurality of scan lines in the unit of K, K being an integer of above 2, wherein
    the plurality of scan line connection sections are substantially parallel to the plurality of metal line layers.

11. The organic electroluminescent device of claim 10, further including
    a plurality of data lines, each connected to at least one of the plurality of ITO films; and
    a plurality of data line connection sections connecting the plurality of data lines in the unit of M, M being an integer of above 2.

12. The organic electroluminescent device of claim 11, wherein each of the plurality of data line connection sections and the plurality of scan line connection sections includes a metal.

13. An organic electroluminescent device having a substrate, a plurality of ITO films and a plurality of metal line layers crossing over the plurality of ITO films, comprising:
    a plurality of data lines each connected to the plurality of ITO films and formed on the substrate;
    a plurality of data line connection sections connecting the plurality of data lines in the unit of L, L being an integer of above 2;

a plurality of scan lines, each scan line formed on the substrate between a pair of the plurality of ITO films, wherein the plurality of scan lines are substantially parallel with the plurality of ITO films; and a scan line connection section connecting the plurality of scan lines, wherein the scan line connection section is substantially parallel to the plurality of metal line layers.

14. The organic electroluminescent device of claim 13, further including, a plurality of luminescent areas on each of the plurality of ITO films;

a connection area on each of the plurality of scan lines;

an insulating layer formed on the plurality of ITO films and the plurality of scan lines so as to expose the plurality of luminescent areas and the connection areas of the plurality of scan lines; and organic layers formed on the plurality of luminescent areas, wherein the plurality of mental line layers are formed on the organic layers and the connection areas in a direction orthogonal to the plurality of scan lines.

15. The organic electroluminescent device of claim 13, wherein each of the plurality of data line connection sections and the scan line connection section includes a metal.

16. An organic electroluminescent device having a substrates, comprising:

a first organic electroluminescent device including a plurality of first data lines, a plurality of first scan lines, at least one first data line connection section connecting the plurality of first data lines, at least one first scan line connection section connecting the plurality of first scan lines, and a plurality of first ITO films, each first ITO film connected to a corresponding one of the plurality of first data lines; and a second organic electroluminescent device including a plurality of second data lines, a plurality of second scan lines, at least one second scan line connection section connecting the plurality of second scan lines, at least one second data line connection section connecting the plurality of second data lines, and a plurality of second ITO films, each second ITO film connected to a corresponding one of the plurality of second data lines, wherein the first data line connection section and the second scan line connection section are located between the first and second organic electroluminescent devices, the first and second scan line connection sections and the first and second data line connection sections are substantially parallel to each other, each of the plurality of first scan lines is located between a respective pair of the plurality of first ITO films and is substantially parallel to the plurality of first ITO films, and each of the plurality of second scan lines is located between a respective pair of the plurality of second ITO films and is substantially parallel to the plurality of second ITO films.

17. The organic, electroluminescent device substrate of claim 16, wherein each of the first data line connection section, the first scan line connection section, the second data line connection section and the second scan line connection section comprise an electric conductor.

* * * * *